(12) United States Patent
Maruyama et al.

(10) Patent No.: US 12,113,155 B2
(45) Date of Patent: Oct. 8, 2024

(54) METHOD OF MANUFACTURING OPTICAL SEMICONDUCTOR DEVICE AND OPTICAL SEMICONDUCTOR DEVICE

(71) Applicant: DOWA Electronics Materials Co., Ltd., Tokyo (JP)

(72) Inventors: Tsukasa Maruyama, Akita (JP); Takashi Araki, Inzai (JP); Takehiro Miyaji, Akita (JP)

(73) Assignee: DOWA Electronics Materials Co., Ltd., Tokyo (JP)

( * ) Notice: Subject to any disclaimer, the term of this patent is extended or adjusted under 35 U.S.C. 154(b) by 343 days.

(21) Appl. No.: 17/754,113

(22) PCT Filed: Sep. 18, 2020

(86) PCT No.: PCT/JP2020/035613
§ 371 (c)(1),
(2) Date: Mar. 24, 2022

(87) PCT Pub. No.: WO2021/060217
PCT Pub. Date: Apr. 1, 2021

(65) Prior Publication Data
US 2022/0293825 A1    Sep. 15, 2022

(30) Foreign Application Priority Data

Sep. 27, 2019  (JP) ................................ 2019-177597

(51) Int. Cl.
*H01L 33/48* (2010.01)
*H01L 33/62* (2010.01)

(52) U.S. Cl.
CPC ............ *H01L 33/486* (2013.01); *H01L 33/62* (2013.01); *H01L 2933/0066* (2013.01)

(58) Field of Classification Search
CPC ....... H01L 23/15; H01L 23/488; H01L 24/16; H01L 33/48; H01L 33/486; H01L 33/52;
(Continued)

(56) References Cited

U.S. PATENT DOCUMENTS

| | | | |
|---|---|---|---|
| 4,769,345 A | 9/1988 | Butt et al. | |
| 7,482,636 B2 * | 1/2009 | Murayama | .......... H01L 25/0753 257/E33.061 |
| 2014/0103798 A1 * | 4/2014 | Yamanaka | ............. H05B 33/04 313/512 |

FOREIGN PATENT DOCUMENTS

| | | |
|---|---|---|
| JP | 2007067373 A | 3/2007 |
| JP | 2007201412 A | 8/2007 |

(Continued)

OTHER PUBLICATIONS

Feb. 16, 2021, International Search Report issued in the International Patent Application No. PCT/JP2020/035613.

(Continued)

*Primary Examiner* — Brook Kebede
(74) *Attorney, Agent, or Firm* — KENJA IP LAW PC

(57) ABSTRACT

The method of manufacturing an optical semiconductor device includes: a mounting step of placing an optical semiconductor chip on a package substrate made of ceramic; a storing step of storing the package substrate after the mounting step in a first dry atmosphere; a placing step of subjecting the optical semiconductor chip on the package substrate to a second dry atmosphere and placing a light transparent window on a joint portion of the package substrate with a joint material therebetween; and a sealing step of joining the joint portion and the light transparent window with the joint material in a low oxygen concentration atmosphere having an oxygen concentration of 1 vol % or
(Continued)

less, thereby encapsulating the optical semiconductor chip in a confined space formed by the package substrate and the light transparent window.

7 Claims, 4 Drawing Sheets

(58) Field of Classification Search
CPC .. H01L 33/58; H01L 33/62; H01L 2933/0066
See application file for complete search history.

(56) References Cited

FOREIGN PATENT DOCUMENTS

| | | | |
|---|---|---|---|
| JP | 2014216532 A | | 11/2014 |
| JP | 2017011200 A | * | 1/2017 |
| JP | 2017098301 A | | 6/2017 |
| JP | 2018093137 A | | 6/2018 |
| WO | WO-2018235925 A1 | * | 12/2018 ............. H01L 23/15 |

OTHER PUBLICATIONS

Feb. 8, 2022, Notification of Reasons for Refusal issued by the Japan Patent Office in the corresponding Japanese Patent Application No. 2019-177597.
Mar. 15, 2022, International Preliminary Report on Patentability issued in the International Patent Application No. PCT/JP2020/035613.

* cited by examiner

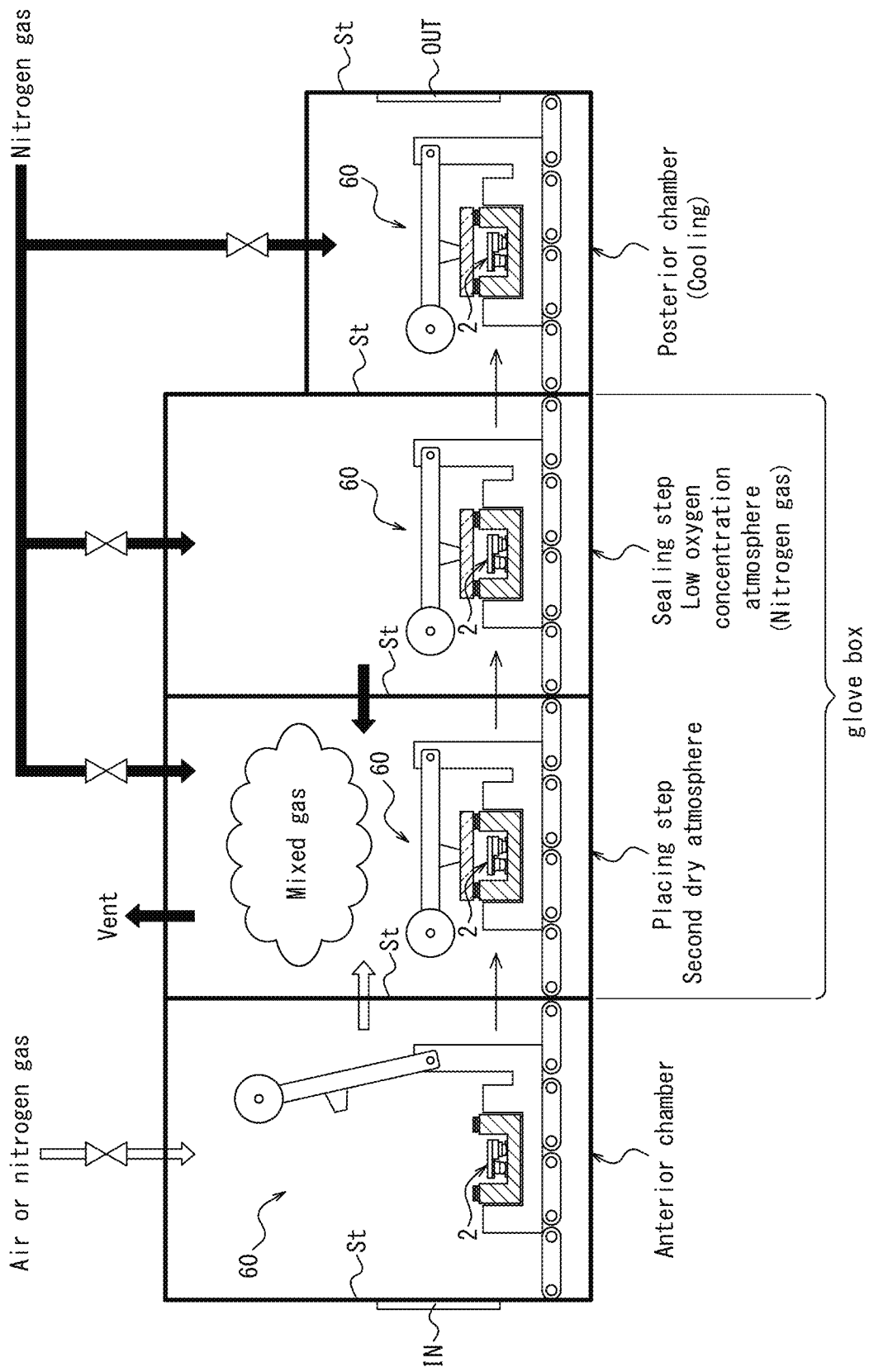

METHOD OF MANUFACTURING OPTICAL SEMICONDUCTOR DEVICE AND OPTICAL SEMICONDUCTOR DEVICE

TECHNICAL FIELD

This disclosure relates to a method of manufacturing an optical semiconductor device and an optical semiconductor device.

BACKGROUND

Optical semiconductor chips roughly fall into two types: light-emitting elements and light-receiving elements. Examples of optical semiconductor devices using light-emitting elements of the above two types include light-emitting diodes and semiconductor lasers. Light-emitting elements are used in various applications depending on the wavelength of the light emitted, for example, infrared light used in various types of sensors, visible light used in lightings and a display light source of electronic devices, or ultraviolet light used for disinfection and resin curing. Any of such optical semiconductor chips are required to have a structure that makes it possible to maintain its performance for a long period of time in various usage environments. For example, an optical semiconductor device having an optical semiconductor chip housed on a package substrate (also referred to as a carrier) is sealed with a transparent window that sufficiently transmits light corresponding to the wavelengths of the optical semiconductor chip (hereinafter referred to as a light transparent window) in terms of obtaining long-term reliability, and has a structure in which the optical semiconductor chip is housed in a closed space into which no outside air flows (hereinafter referred to as confined space). A method of sealing to form such a confined space typically uses a technique of sealing by joining together a container on which light-emitting elements are placed, such as a package substrate and a light transparent window using a solder joint such as AuSn or AgSn. Examples of the technique of sealing an optical semiconductor device includes, for example, a technique of JP 2018-093137 A (PTL 1).

PTL 1 discloses a technique of temporarily sealing a package substrate adapted to house an optical semiconductor device and a lid in an atmosphere containing oxygen, and then reducing the oxygen concentration in the atmosphere with the temporary sealing being kept, thereby joining and sealing the package substrate and the lid.

CITATION LIST

Patent Literature

PTL 1: JP 2018-093137 A

SUMMARY

Technical Problem

However, it was found that the reliability of an optical semiconductor chip cannot be ensured by only sealing an optical semiconductor chip in an atmosphere gas containing a small amount of oxygen as in the manufacturing method in PTL 1 above. Since the drive voltage is higher as the emission wavelength is shorter, light-emitting elements emitting, for example, ultraviolet light with a wavelength of 200 nm to 350 nm, in particular, generate more heat when being energized compared with other elements, so that heat resistant reliability is required to be ensured for such elements. Further, in environments where an optical semiconductor chip is required to operate at high temperatures, for example, when used in a high temperature and high humidity environment or continuously used for a long time, as the heat generated by the optical semiconductor chip being energized is more intense, the operation reliability at high temperatures is hardly obtained.

To address this problem, it could be helpful to provide an optical semiconductor device with which high reliability of a semiconductor chip operating at high temperatures is maintained for a long time and a method of manufacturing the same.

Solution to Problem

The present inventors made diligent studies with a view to solving the above problem and found that in environments where an optical semiconductor chip is required to operate at high temperatures, the reliability of the optical semiconductor chip cannot be ensured when more than a certain amount of residual moisture remains around the optical semiconductor chip housed in the confined space. It was also found that the reliability of the optical semiconductor chip cannot be ensured when the moisture contained in the confined space after the sealing exceeds 1000 ppm even if a step of sealing a ceramic package substrate and a light transparent window between which an optical semiconductor chip is placed is performed in a nitrogen atmosphere. The inventors studied the cause of the moisture being contained in a confined space and found that even if the moisture concentration of the atmosphere around the optical semiconductor chip is temporarily reduced using for example a nitrogen gas while sealing, moisture penetrated into the ceramic cannot be removed easily and is released during heating in the sealing step, and thus the amount of moisture in the confined space is high. Even when the package substrate is heated in a mounting step and most of the moisture in the surface of the ceramic is removed, moisture penetrates into the package substrate when the ceramic package substrate is exposed to the atmosphere for longer than a certain period of time after the mounting step. It was found that the amount of residual moisture in the confined space cannot be maintained low after sealing unless the absorption of moisture by the ceramic is precluded in an environment having a moisture concentration of 1000 ppm or less from heating in the mounting step to heating in the sealing step.

This disclosure is made based on the above findings, and has the following features.

[1] An aspect of this disclosure is a method of manufacturing an optical semiconductor device, comprising:
- a mounting step of placing an optical semiconductor chip on a package substrate made of ceramic;
- a storing step of storing the package substrate after the mounting step in a first dry atmosphere;
- a placing step of subjecting the optical semiconductor chip on the package substrate to a second dry atmosphere and placing a light transparent window on a joint portion of the package substrate with a joint material therebetween; and
- a sealing step of joining the joint portion and the light transparent window with the joint material in a low oxygen concentration atmosphere having an oxygen concentration of 1 vol % or less, thereby encapsulating the optical semiconductor chip in a confined space formed by the package substrate and the light transparent window, wherein the confined space after the sealing step has a moisture concentration of 1000 ppm or less and an oxygen concentration of 3 vol % or less.

[2] The method of manufacturing an optical semiconductor device, according to [1] above, wherein the first dry atmosphere has a moisture concentration of 1000 ppm or less, and the second dry atmosphere has a moisture concentration of 1000 ppm or less and an oxygen concentration of 4 vol % or less.

[3] The method of manufacturing an optical semiconductor device, according to [1] or [2] above, wherein the confined space after the sealing step has a moisture concentration of 300 ppm or less and an oxygen concentration of 0.8 vol % or less.

[4] The method of manufacturing an optical semiconductor device, according to [1] or [2] above, wherein the second dry atmosphere has a moisture concentration of 200 ppm to 1000 ppm and an oxygen concentration of 3 vol % or less.

[5] The method of manufacturing an optical semiconductor device, according to [4] above, wherein the second dry atmosphere has a moisture concentration of 200 ppm to 550 ppm.

[6] Another aspect of this disclosure is an optical semiconductor device, comprising:

a package substrate made of ceramic; and an optical semiconductor chip placed on the package substrate, wherein the optical semiconductor chip is encapsulated in a confined space between a light transparent window and the package substrate, the light transparent window being joined to a joint material on a joint portion of the package substrate therebetween, and the confined space has a moisture concentration of 1000 ppm or less and an oxygen concentration of 3 vol % or less.

[7] The optical semiconductor device according to [6] above, wherein a center emission wavelength of the optical semiconductor chip is 200 nm to 350 nm. (Advantageous Effect)

This disclosure can provide an optical semiconductor device that maintains high reliability of an optical semiconductor chip for a long period of time even when the chip is operated at high temperatures and a method of manufacturing the optical semiconductor device.

BRIEF DESCRIPTION OF THE DRAWINGS

In the accompanying drawings:

FIG. 4 illustrates an example of an aspect of a method of manufacturing an optical semiconductor device, according to this disclosure.

DETAILED DESCRIPTION

Analytical Method

Figure 1:
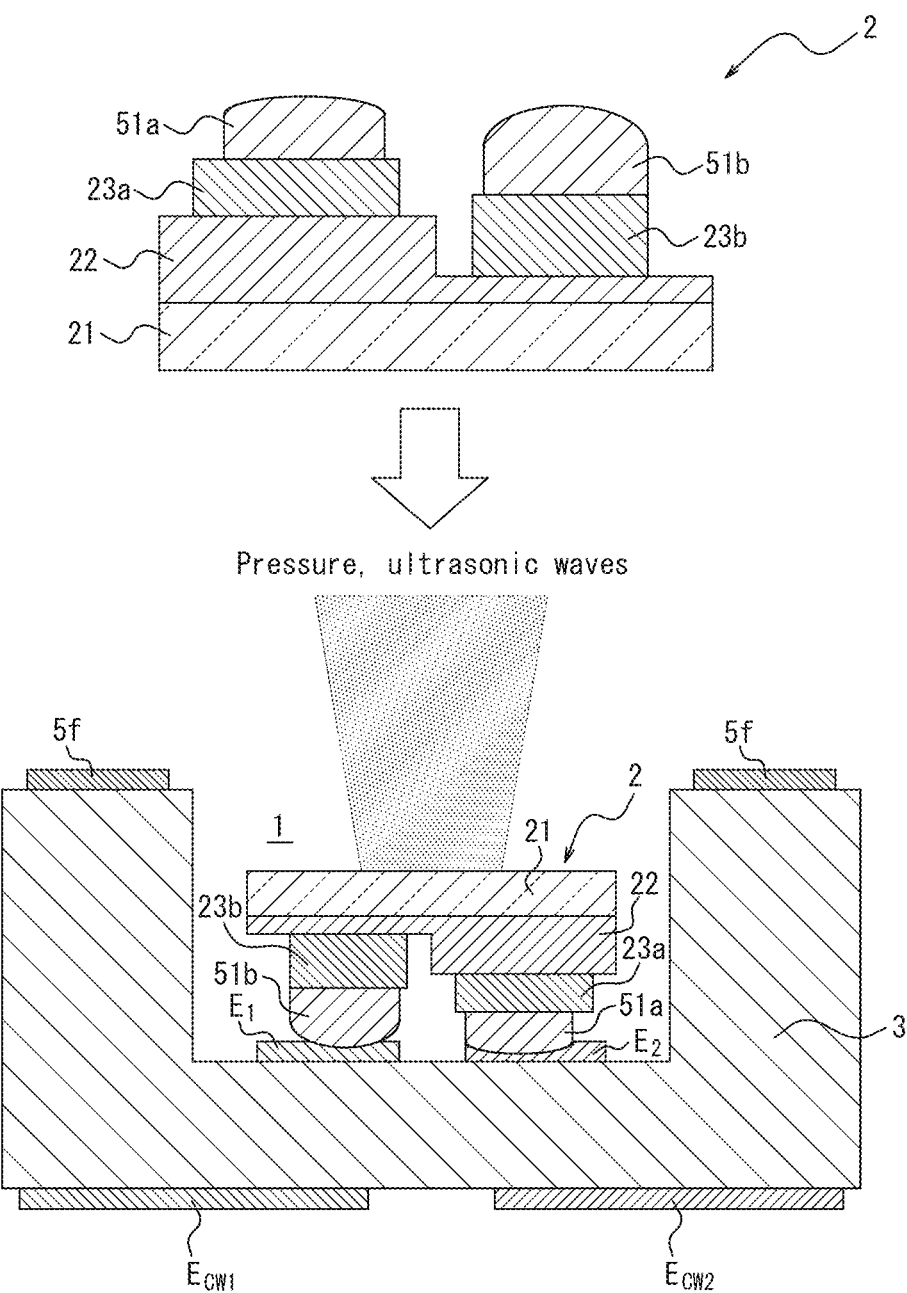
FIG. 1 illustrates an example of a mounting step in a method of manufacturing an optical semiconductor device, according to this disclosure.

For methods of measuring the moisture concentration and the oxygen concentration of a first dry atmosphere and a second dry atmosphere in this specification, the moisture concentration can be measured using a moisture meter and the oxygen concentration can be measured using an oxygen meter. For a moisture meter, a capacitive (impedance) dew point meter can be used; for example, TK-100 manufactured by TEKHNE Corporation can be used. For an oxygen meter, an electro-galvanic oxygen analyzer can be used; for example, 201RS manufactured by TEKHNE Corporation can be used.

For methods of measuring the moisture concentration and the oxygen concentration of the confined space formed by a package substrate and a light transparent window, quantitative analysis can be performed using a mass spectrometer (Internal Vapor Analysis (IVA)), and the inside of the confined space can be analyzed by removing the light transparent window at a sample inlet. The IVA analysis is in accordance with the MIL standards (MIL-STD-883).

(Optical Semiconductor Chip)

The optical semiconductor chip may be any light-emitting element or light-receiving element as long as ceramic is used for the package substrate on which the chip is placed and the chip is encapsulated in the confined space. Examples of optical semiconductor chips used in such a state include an optical semiconductor chip for deep ultraviolet light wavelengths (wavelengths: 200 nm to 350 nm). In particular, light-emitting elements for deep ultraviolet light (wavelengths: 200 nm to 350 nm) are preferred due to high heat generation in operation. Although a flip chip bonded optical semiconductor chip is described as an example in the embodiments described below, a vertical optical semiconductor chip is possible.

(Package Substrate)

The package substrate is made of ceramic. The ceramic may be either low temperature co-fired ceramic (LTCC) or high temperature co-fired ceramic (HTCC). Further, examples of the material of the ceramic include aluminum nitride (AlN), alumina ($Al_2O_3$), silica ($SiO_2$), and titanium dioxide ($TiO_2$). If necessary, the ceramic may contain an insulating material, a metal compound, a plasticizer, an organic binder or an organic solvent that are known.

(Light Transparent Window)

The light transparent window may be any transparent window as long as it transmits sufficient light with the wavelengths of the above optical semiconductor chip. In the case of an optical semiconductor chip for an ultraviolet light wavelength (wavelength: 200 nm to 350 nm), a material having a transmittance of 80% or more to light with the wavelength is preferred; examples include quartz, fused quartz, calcium fluoride ($CaF_2$), and sapphire ($Al_2O_3$). In this embodiment, as an example of the shape of the light transparent window, a flat plate body is described; alternatively, a window having a curved surface on the light extraction side may be used in the optical semiconductor device of this disclosure. Thus, the shape of the light transparent window is not limited. Further, in order to enhance the transmissivity, a known AR coating (anti-reflection film) or a photonic crystal may be provided on either one or both of the surfaces of the body of the light transparent window.

The manufacturing method according to this disclosure includes a mounting step, a storing step, a placing step, and a sealing step, and may further include an exposing step if necessary. The steps of one embodiment will now be described in detail.

(Mounting Step)

A mounting step of placing an optical semiconductor chip on a package substrate made of ceramic is described with reference to FIG. 1. The mounting step is a step of placing an optical semiconductor chip on a placement portion of a package substrate 3 on which an optical semiconductor chip 2 can be placed. First, an optical semiconductor chip 2 including a substrate 21, a semiconductor laminate 22, and electrode layers 23a and 23b is prepared. Joint metals 51a and 51b such as Au bumps are then formed on the surface of the electrode layers 23a and 23b of the optical semiconductor chip 2.

FIG. 1 illustrates an example in which the package substrate 3 has a recess 1 in its center portion, and the optical semiconductor chip 2 is placed in the recess 1. In this example, the joint metals 51a and 51b provided on the surface of the electrode layers 23a and 23b of the optical semiconductor chip 2 are provided to face and adhere to the surface (placement portion) of surface electrodes $E_2$ and $E_1$ formed on the bottom of the recess 1 of the package substrate 3, and meanwhile a suitable load is applied to the optical semiconductor chip 2 to perform ultrasonic welding. In this case, the package substrate 3 is preferably heated to transfer heat to the placement portion.

The position and the shape of the placement portion are not limited as long as the optical semiconductor chip 2 can be housed and sealing between a window (not shown) and the package substrate 3 can be performed by welding.

Note that the above surface electrodes $E_1$ and $E_2$ are electrically connected to rear surface electrodes $E_{cw1}$ and $E_{cw2}$ provided on the back surface of the package substrate 3, respectively, via wiring electrodes (not shown) through the package substrate 3.

The working atmosphere in the mounting step is appropriately selected depending on the kind of the joint metals 51a and 51b. For example, when gold bumps are used as the joint metals 51a and 51b, the working atmosphere may be air or a low oxygen atmosphere. In cases where a solder such as AuSn is used, in terms of suppressing oxidation of the joint metals 51a and 51b, the working atmosphere in the mounting step is preferably a low oxygen atmosphere such as a nitrogen or argon atmosphere. In order to ensure the welding using the gold bumps, heating is performed such that the temperature of the placement portion reaches 170° C. to 250° C.; when a solder such as AuSn is used, heating is preferably performed such that the temperature of the placement portion reaches around the melting point of the solder (for example, 200° C. to 320° C.). In the heating in the mounting step, most of moisture in the package substrate 3 is diffused.

Prior to performing the mounting step according to this disclosure, the method may further include a step of baking the package substrate at temperatures of 125° C. to 250° C. for 30 min or more as necessary. This can almost completely diffuse and remove moisture from the package substrate. When the package substrate of which moisture has been reduced by the heating in the mounting step is exposed to an environment having moisture, the moisture is adsorbed on the surface of the package substrate and is considered to penetrate the inside of the package.

(Storing Step)

Next, a storing step of storing the package substrate after the above mounting step in a first dry atmosphere will be described. This step precludes moisture from being adsorbed on the package substrate from which moisture has been removed to some extent by heating in the above mounting step and from repenetrating into the ceramic. To this end, storing is carried out in the first dry atmosphere until the step proceeds to the next step (placing step and sealing step). The temperature of the package substrate at that point may only be a temperature lower than the temperature thereof in the mounting step, and may be room temperature. The storing time in the storing step depends on any given timing of the next placing step, and is preferably 1 min or more. The mounting step, the storing step, and the subsequent placing step are preferably performed continually, and preferably there is no break that is longer than 1 min and is due to the human working environment between the steps thereby avoiding exposure to the atmospheric environment.

<First Dry Atmosphere in Storing Step>

A first dry atmosphere herein refers to an atmosphere that dries the package substrate enough to minimize moisture penetrating into the package substrate. The moisture concentration of the first dry atmosphere is preferably 1000 ppm or less, more preferably 550 ppm or less. Further, the dew point is preferably −20° C. or less, more preferably −27° C. or less.

In order to obtain an atmosphere that dries the package substrate enough to minimize moisture penetrating into the package substrate, it is also preferred that the pressure in the first dry atmosphere is reduced. For example, the pressure in the first dry atmosphere is preferably $10^{-2}$ [Pa] or less, more preferably $10^{-5}$ [Pa] or less.

Examples of apparatuses that provide the above first dry atmosphere include batch drying mechanisms such as desiccators and air ovens, and continuous drying mechanisms such as heating rolls, hot air through mechanism (for example, a unit in which an object to be dried is moved and passed inside an open drying furnace and is heated and dried while being subjected to an air flow). A decompression mechanism used for the above pressure reduction may be used for the drying; for example, a vacuum storage cabinet, a vacuum desiccator, an aspirator, etc. can be used. Further, such a drying mechanism or decompression mechanism preferably has a temperature controlling mechanism, and the temperature of the first dry atmosphere may be set to 0° C. or more to 100° C. or less if necessary. Further, the apparatus providing the first dry atmosphere is preferably a nitrogen gas purging system.

For the desiccator, an electronic dry unit (electronic moisture proof cabinet) is preferably used. Examples include SD-252-01 manufactured by Toyo Living Co., Ltd. and SDC-1502-1A available from Yamato Scientific Co., Ltd.

Further, a transfer mechanism such as a conveyer belt may be placed between the apparatus used in the mounting step and the apparatus used in the placing step. Further, a shutter for defining those steps may be provided. Moreover, the transfer mechanism and the shutter may be provided between the apparatus used in the mounting step and the apparatus used in the placing step, and a structure to which the apparatus providing the above first dry atmosphere is connected may be provided between the apparatuses.

(Placing Step)

a placing step of subjecting the optical semiconductor chip on the package substrate to the second dry atmosphere and placing a light transparent window on a joint portion of the package substrate with a joint material therebetween will be described with reference to FIG. 2.

The package substrate 3 on which the optical semiconductor chip 2 is placed, which has been withdrawn from the first dry atmosphere in the storing step has a structure in which a first metal layer 5f for sealing is formed on a joint portion 5 of an upper part 34 of a peripheral portion of the recess 1 to surround the recess 1. A second metal layer 5d for sealing is similarly formed to surround the periphery of a light transparent window 4. In the placing step, the above first metal layer 5f and the second metal layer 5d are placed to face one another and abut one another with a joint material 5e therebetween. In this situation, the joint material 5e may be first attached to either the first metal layer 5f or the second metal layer 5d. In order to maintain the state where the light transparent window 4 is placed on the package substrate 3, a temporary retaining unit 60 as illustrated in FIG. 2 is preferably used. The temporary retaining unit 60 includes a temporary retainer body 61 for housing the package substrate 3, an arm 62 for holding the light transparent window 4 to avoid displacement, and a weight 63.

This placing step allows the optical semiconductor chip 2 to be housed in the space 1 formed by the package substrate 3 and the light transparent window 4 and allows the space 1 to be a space that is not completely but substantially closed. Accordingly, when the optical semiconductor chip 2 (and the light transparent window 4) on the package substrate 3 is surrounded by the second dry atmosphere, the second dry atmosphere substantially becomes the environment in the confined space 1 to be obtained, aside from the dissipation from the ceramic due to heating in the subsequent sealing step. With respect to the steps subsequent to the step of placing the light transparent window 4 serving as a cover, PTL 1 describes that the oxygen concentration of the closed space changes (decreases) in a nitrogen atmosphere. However, studies by the inventors revealed that there is little replacement of gas between the space substantially closed with the cover and the external environment unless an air pressure difference is created due to temperature changes or the like.

<Second Dry Atmosphere Conditions in Placing Step>

The second dry atmosphere herein refers to an atmosphere that maintains a state where increase of moisture is controlled due to the first dry atmosphere, and reduces oxygen in the space formed by the package substrate and the light transparent window (to be a confined space), in which the optical semiconductor chip is housed. The moisture concentration of the second dry atmosphere is preferably 1000 ppm or less, more preferably 550 ppm or less. Further, the oxygen concentration of the second dry atmosphere is preferably 4 vol % or less, more preferably 3 vol % or less.

In order to obtain the oxygen concentration of the second dry atmosphere within the above range, the second dry atmosphere is preferably formed using at least an inert gas (for example, nitrogen). When the placing step is performed manually, the step is preferably performed using a glove box, for example, taking into account safety considerations. When the second dry atmosphere is formed in such a manner that an inert gas and the air are mixed, the position to supply the inert gas is controlled so that the second dry atmosphere fills the space formed by the package substrate and the light transparent window, in which at least the optical semiconductor chip is housed (to be the confined space). In the placing step, as will be for example described in Example 1 with reference to FIG. 4, when a member having been withdrawn from the cabinet (electronic dry unit, vacuum desiccator, etc.) in the storing step (the package substrate housing the optical semiconductor chip on which the light transparent window is placed) is manually moved from an anterior chamber of the glove box into the glove box, the atmosphere containing air in the anterior chamber of the glove box enters the glove box, thus the second dry atmosphere in a mixed gas state is formed. When the second dry atmosphere in the mixed gas state has a moisture concentration of 200 ppm to 1000 ppm and an oxygen concentration of 3 vol % or less, the confined space to be obtained is further ensured to have a moisture concentration of 1000 ppm or less and an oxygen concentration of 3 vol % or less.

On the other hand, when the atmosphere in the anterior chamber of the glove box is purged with nitrogen in the placing step or when the steps from the storing step are automatically performed using a robot or the like, the second dry atmosphere can be an inert gas atmosphere such as a nitrogen atmosphere. In that case, controlling the oxygen concentration and the moisture concentration to lower levels than those of the second dry atmosphere in the mixed gas state also allows the confined space to have a moisture concentration of 300 ppm or less and an oxygen concentration of 0.8 vol % or less after the sealing step.

In the above second dry atmosphere in the mixed gas state in which an inert gas and the air are mixed, the mixing ratio between the inert gas and the air is preferably between 5:1 and 10:0. The air here is preferably air with a low moisture content. Thus, the content of moisture contained in that atmosphere can be reduced and the concentration of moisture contained in the second dry atmosphere when the inert gas is mixed within the above range for the second dry atmosphere.

(Exposing Step)

In the placing step described above, an exposure time from subjecting the optical semiconductor chip on the package substrate to the second dry atmosphere to placing the light transparent window on the joint portion of the package substrate with a joint material therebetween is preferably 10 s or more and 1 min or less. Exposing the package substrate housing the optical semiconductor chip to the second dry atmosphere for the exposure time is the exposing step. Even when the exposing step in the second dry atmosphere is not performed, the first dry atmosphere left around the optical semiconductor chip on the package substrate is replaced with the second dry atmosphere to some extent by placing the optical semiconductor chip in the second dry atmosphere; on the other hand, when an exposure time is provided, the first dry atmosphere is completely replaced with the second dry atmosphere, thus the oxygen concentration is ensured to be reduced. Even if the exposure time is increased, the moisture having penetrated into the package substrate is hardly reduced, so that the above storing step is necessary.

In the exposing step, preferably, a nozzle for the gas used to form the second dry atmosphere (inert gas and others) is directed to the position of the optical semiconductor chip, and has a shape such that the atmosphere in the space surrounded by the package substrate housing the optical semiconductor chip and the light transparent window (to be the confined space) is forcibly flown to be replaced.

Further, since typically little gas is adsorbed on the light transparent window, the light transparent window may be placed after being subjected to the second dry atmosphere, and the exposure time for the light transparent window is optionally provided.

(Sealing Step)

Figure 3:
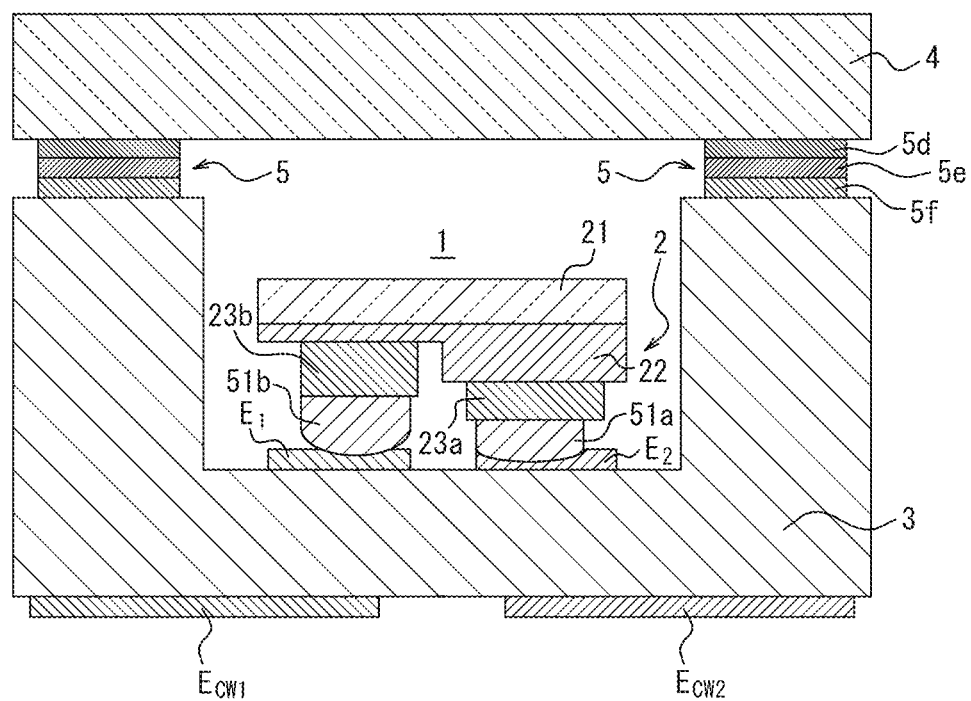
FIG. 3 is a cross-sectional view of an optical semiconductor device according to one embodiment of this disclosure.

In the sealing step, the joint portion provided on the package substrate and the light transparent window that have abutted one another in the placing step are joined and sealed using the joint material, thereby forming a confined space formed by the package substrate housing the optical semiconductor chip and the light transparent window, in which the optical semiconductor chip 2 is housed. Referring to FIG. 3, the first metal layer 5f of the joint portion and the second metal layer 5d on the light transparent window 4 side are joined with the joint material 5e without any gap, thereby forming the confined space 1 that houses the optical semiconductor chip 2 and is isolated from the external environment. The first metal layer 5f of the joint portion and the second metal layer 5d on the light transparent window 4 side are not limited and may be metals that easily adhere to the package substrate 3 and the light transparent window 4, respectively and can be used to metalize the joint material to be described.

The method for joining using the joint material in the sealing step may be, but not limited to, brazing and soldering, fusion, heat welding, etc. and is appropriately selected depending on the characteristics of the joint material used or the intended use. In terms of increased airtightness, solder welding by heating using an AuSn solder or the like, or using a joint paste containing metal particles is preferred; when a solder such as AuSn is used, the placement portion is preferably heated to a temperature around the melting point of the solder (for example, 200° C. to 320° C.), and heating to 150° C. or higher is also preferably performed in the case of using a joint paste. When the package substrate made of ceramic is stored in the first dry atmosphere in the storing step so as to avoid exposure to the atmosphere for longer than a certain period of time after the mounting step, the concentration of moisture in the confined space 1 can be prevented from being increased by moisture released into the confined space 1 from the ceramic due to heating in the sealing step. The atmosphere in the sealing step is a low oxygen concentration atmosphere having an oxygen concentration of 1 vol % or less, preferably an oxygen concentration of 0.1 vol % or less so that the oxygen concentration of the confined space 1 is prevented from being increased to prevent the joint material from being oxidized in the sealing step. The low oxygen concentration atmosphere preferably uses an inert gas such as nitrogen or argon. The moisture concentration in the sealing step is preferably 1000 ppm or less, more preferably 550 ppm or less, and still more preferably 300 ppm or less as with the second dry atmosphere.

Further, the sealing step is preferably performed in a state where the package substrate is housed in the temporary retaining unit in the placing step. The airtightness is expected to be increased by performing the joining while controlling the alignment between the package substrate 3 and the light transparent window 4 and applying an appropriate load to the joint material using the weight.

<Moisture Concentration of Confined Space Housing Optical Semiconductor Chip>

The moisture concentration of the confined space 1 is preferably 1000 ppm or less, more preferably 550 ppm or less, and still more preferably 300 ppm or less. Further, the oxygen concentration of the confined space is preferably 3 vol % or less, more preferably 1 vol % or less, and still more preferably 0.8 vol % or less.

A moisture concentration of 1000 ppm or less and an oxygen concentration of 3 vol % or less reduces the reaction between the inside residual moisture and the materials forming the optical semiconductor chip, which can provide high reliability such that for example when a current of 100 mA is passed at 85° C. for 10000 hours, the ratio of the residual output with respect to the initial output is 81% or more.

When nitrogen is used as the inert gas used in the second dry atmosphere, the gas composition in the confined space 1 preferably has 0.0 vol % to 3.0 vol % oxygen ($O_2$), 95.0 vol % to 99.9 vol % nitrogen ($N_2$), and 0 vol % to 0.1 vol % (0 ppm to 1000 ppm) water ($H_2O$), more preferably has 0.0 vol % to 1.0 vol % oxygen ($O_2$), 98.0 vol % to 99.99 vol % nitrogen ($N_2$), and 0.0 vol % to 0.03 vol % (0 ppm to 300 ppm) water ($H_2O$).

(Variations)

In this embodiment, as an example shape of a package substrate, a rectangular case having a cuboidal recess with an open top is described. The recess of the package substrate has a shape such that a confined space can be obtained by placing a light transparent window to be described, and any shape is possible as long as the confined space that houses the optical semiconductor chip can be obtained in combination with the shape of the light transparent window. In another embodiment, for example, the package substrate may be a flat plate without a recess if the light transparent window has a recess that opens on the lower side. Further, when the package substrate has a recess, the recess may have an inverse tapered shape with the cross sectional area being increased toward the open end (or a tapered shape).

Further, in another embodiment of the mounting step, modifications can be made to the manner illustrated in FIG. 1. In a specific variation of the mounting step, a method may be used in which the Au bumps 51a and 51b are previously attached to the surface electrodes $E_1$ and $E_2$ on the placement portion provided on the package substrate 3 or pieces of solder are previously attached to the placement portion on the surface electrodes $E_1$ and $E_2$ on the placement portion provided on the package substrate 3. Alternatively, a method may be used in which a solder paste is previously applied to the surface electrodes $E_1$ and $E_2$ on the placement portion provided on the package substrate 3. Further, a solder layer 54 of AuSn etc. may be formed (deposited for example) on the surface of the electrode layers 23a and 23b of the optical semiconductor chip 2; specifically, the solder layer 54 of AuSn etc. may be previously formed (deposited for example) on the surface of the electrode layers 23a and 23b of the optical semiconductor chip 2 and a flux may be applied to the surface electrodes $E_1$ and $E_2$ on the placement portion provided on the package substrate 3.

Figure 2:
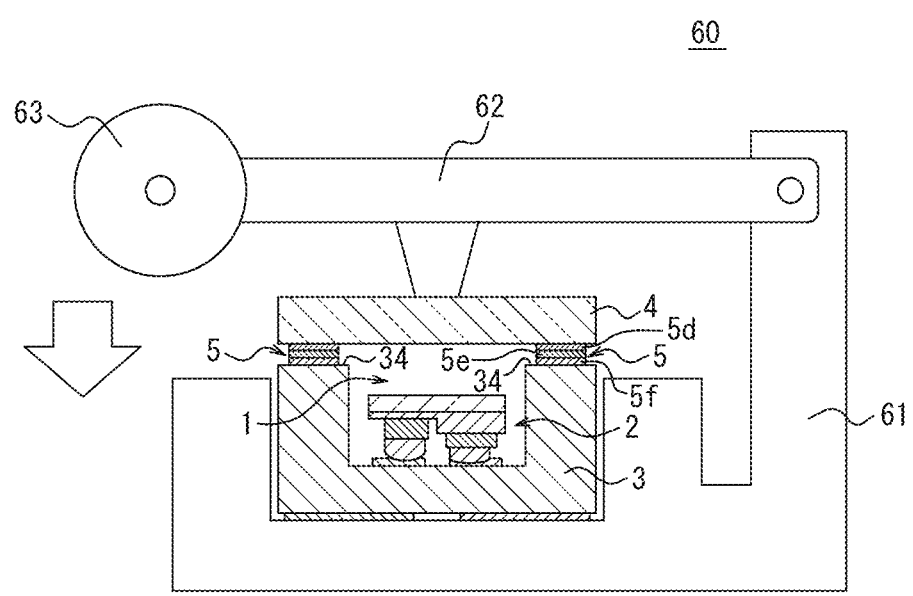
FIG. 2 illustrates an example of a placing step in the method of manufacturing an optical semiconductor device, according to this disclosure.

Further, in another embodiment of the placing step, a modification can be made to the shape of the temporary retaining unit in FIG. 2. In addition, various modifications may be made to the ways of applying a load and alignment given in FIG. 2; moreover, for example, the light transparent window 4 may be placed on the temporary retainer body 61 side such that the opening of the package substrate 3 faces the light transparent window, and a load may then be applied to the package substrate 3.

According to the embodiments of the manufacturing method described above, an optical semiconductor device can be obtained which has a package substrate made of ceramic and an optical semiconductor chip placed on the package substrate, in which the optical semiconductor chip is encapsulated in a confined space between a light transparent window joined to a joint portion of the package substrate with a joint material therebetween and the package substrate, and the confined space has a moisture concentration of 1000 ppm or less and an oxygen concentration of 3 vol % or less. The center emission wavelength of the optical semiconductor chip is preferably 200 nm to 350 nm.

EXAMPLES

The following provides a more detailed description of this disclosure using examples. However, this disclosure is not in any way limited by the following examples.

Example 1

An optical semiconductor chip used in this example (an LED with a product name of DF8XC-00001 (manufactured by DOWA Electronics Materials Co., Ltd.) (using DoU-VLEDs (a registered trademark in Japan, other countries, or both) technology)) is an LED chip including an AlGaN crystal that emits light with a wavelength of 280 nm. The LED chip was sized 1 mm×1 mm×0.43 mm.

A package substrate used in this example was prepared by stacking six green sheets with a thickness of 150 μm using, as a material, high temperature co-fired ceramic (HTCC) using AlN powder as a ceramic material. The package had an outer size of 3.50 mm×3.50 mm and a thickness of 0.9 mm, and had a recess with a depth of 0.6 mm. Further, for the package substrate, the surface electrodes $E_1$ and $E_2$ and the rear surface electrodes $E_{cw1}$ and $E_{cw2}$, through holes not shown, and a frame-shaped first metal layer were formed by Au plating.

A light transparent window used in this example used quartz glass. A frame-shaped second metal layer was formed on the quartz glass. The second metal layer was prepared by vapor depositing Cr as an underlying metal on a quartz glass substrate, vapor depositing Pt thereon, and vapor depositing Au thereon. The window had an outer size of 3.45 mm×3.45 mm and a thickness of 0.5 mm.

An Au bumped chip was prepared by previously attaching total 25 Au bumps to the above LED chip. In a mounting step, the Au bumped chip was placed on the surface electrodes $E_1$ and $E_2$ of the above package substrate; the package substrate was placed and heated on a 200° C. stage; and ultrasonic welding was performed while crushing the Au bumps by applying pressure. The environment in the mounting step was the atmospheric environment.

Immediately after the mounting step, a storing step of storing the package substrate including the LED chip in a desiccator under the following dry atmosphere conditions during storing step using an electronic dry unit (electronic moisture proof cabinet) as the desiccator in the storing step. The dry atmosphere conditions during storing step were such that the moisture concentration was 0.03 vol % (300 ppm) and the moisture concentration in the desiccator was maintained at 1000 ppm or less even if the desiccator was opened and closed (corresponding to the "first dry atmosphere" in the embodiments).

Subsequently, a placing step was performed using a globe box illustrated in FIG. 4. Referring to FIG. 4, the steps from the placing step to finishing of an optical semiconductor device are described. In more detail, in order to perform the placing step, the package substrate provided with an LED chip 2 was stored inside the body of the temporary retaining unit 60 from the desiccator in the storing step with the top of the recess in the package substrate being open; and immediately after that, the temporary retaining unit 60 was moved into the anterior chamber next to the glove box and the inlet IN was closed, and the anterior chamber was purged with nitrogen. A shutter St between the anterior chamber and the glove box was opened, and the package substrate was moved from the anterior chamber into the glove box. An exposing step of exposing the LED chip 2 to a nitrogen gas (the atmosphere in the placing step that corresponds to the "second dry atmosphere" in the embodiments) in the glove box and maintaining the state for 40 s was performed. After that, an AuSn solder sheet (joint material) was placed on the first metal layer on top of the package substrate, and a light transparent window was placed so that the joint material is sandwiched between the first metal layer and the second metal layer on the light transparent window. The light transparent window was fixed using the arm and weight of the temporary retaining unit 60. Meanwhile, a load of 5.5 gf was applied using the weight. An analysis on the vent gas from the globe box in the placing step demonstrated that the atmosphere in the placing step was a nitrogen gas, and the moisture concentration of the vent gas was 2.6 ppm. A capacitive (impedance) dew point meter, TK-100 manufactured by TEKHNE Corporation was used to analyze the dry atmospheres in the storing step and the placing step.

After that, in the sealing step, the package substrate provided with the LED chip 2 was moved together with the temporary retaining unit 60 housing the LED chip into the atmosphere filled with a low oxygen concentration atmosphere (oxygen concentration: 0.1 vol %, moisture concentration: 2.6 ppm) obtained using nitrogen gas. With the load being applied using the weight, the package substrate was heated to a temperature equal to or higher than the melting point of the solder sheet (300° C. to 310° C.), was moved to a posterior chamber when the solder melted, and was cooled in nitrogen, thereby joining the first metal layer and the second metal layer, thus an optical semiconductor device in which the LED chip 2 is housed in a confined space was fabricated. The structure of the optical semiconductor device fabricated by the manufacturing method of this example was as illustrated in FIG. 3.

Example 2

An LED package of Example 2 was obtained in the same manner as in Example 1 except that the package substrate was baked at 250° C. for 30 min before performing the mounting step.

Example 3

In Example 3, the package substrate (LED chip) after the storing step was housed in the body of the temporary retaining unit 60 with the with the top of the recess in the package substrate being open, and was moved into the anterior chamber of the globe box to which air (10° C., relative humidity: 15.4%) was flown and the inlet was closed; the shutter St between the anterior chamber and the globe box was opened immediately after that without performing nitrogen purging of the anterior chamber, and the package substrate was moved from the anterior chamber into the glove box. Thus, an LED package of Example 3 was obtained in the same manner as in Example 1 except that the atmosphere in the placing step of Example 3 was a mixed gas of nitrogen gas and air (10° C., relative humidity: 15.4%), and an exposing step of exposure to the mixed gas of nitrogen gas and air (second dry atmosphere) and maintaining the state for 40 s was performed. Vent gas from the glove box in the placing step was subjected to analyses using an electro-galvanic oxygen analyzer (201RS manufactured by TEKHNE Corporation) and the above capacitive (impedance) dew-point meter, and the atmosphere in the placing step was found to have a moisture concentration of 200 ppm and an oxygen concentration of 2.3 vol %. The mixing volume ratio (nitrogen gas: air) of the atmosphere in the placing step was 8:1.

Example 4

Example 4 was the same as Example 3 except that the air supplied into the anterior chamber had a temperature of 10° C. and a relative humidity of 21.5%. Vent gas from the glove box in the placing step was subjected to analyses using the electro-galvanic oxygen analyzer and the above capacitive (impedance) dew-point meter, and the atmosphere in the placing step of Example 4 was found to have a moisture concentration of 303 ppm and an oxygen concentration of 2.5 vol %. The mixing volume ratio (nitrogen gas: air) of the atmosphere in the placing step was 7.4:1.

Example 5

Example 5 was the same as Example 3 except that the air supplied into the anterior chamber had a temperature of 10° C. and a relative humidity of 30%. Vent gas from the glove box in the placing step was subjected to analyses using the electro-galvanic oxygen analyzer and the above capacitive (impedance) dew-point meter, and the atmosphere in the placing step of Example 5 was found to have a moisture concentration of 505 ppm and an oxygen concentration of 3.0 vol %. The mixing volume ratio (nitrogen gas: air) of the atmosphere in the placing step was 6:1.

Comparative Example 1

An LED package of Comparative Example 1 was obtained in the same manner as in Example 1 except that, in the storing step, the package substrate was stored in air (temperature: 23° C., relative humidity: 30%) for 1 hour instead of in the dry atmosphere of the storing step in Example 1.

Comparative Example 2

An LED package of Comparative Example 2 was obtained in the same manner as in Example 5 except that, in the storing step, the package substrate was stored in air (temperature: 23° C., relative humidity: 30%) for 1 hour instead of in the dry atmosphere of the storing step in Example 1, and in the placing step, the atmosphere in the anterior chamber of the globe box was changed to air (temperature: 50° C., relative humidity: 15.4%). The mixing volume ratio (nitrogen gas: air) of the atmosphere in the placing step was 6:1. Vent gas from the glove box in the placing step was subjected to analyses using the electro-galvanic oxygen analyzer and the above capacitive (impedance) dew-point meter, and the atmosphere in the placing step of Comparative Example 2 was found to have a moisture concentration of 2275 ppm and an oxygen concentration of 3.0 vol %.

Comparative Example 3

An LED package of Comparative Example 3 was obtained in the same manner as in Example 5 except that, in the storing step, the package substrate was stored in air (temperature: 23° C., relative humidity: 30%) for 1 hour instead of in the dry atmosphere of the storing step in Example 1, and in the placing step, the atmosphere in the anterior chamber of the globe box was changed to air (temperature: 23° C., relative humidity: 30%). The mixing volume ratio (nitrogen gas: air) of the atmosphere in the placing step was 6:1. Vent gas from the glove box in the placing step was subjected to analyses using the electro-galvanic oxygen analyzer and the above capacitive (impedance) dew-point meter, and the atmosphere in the placing step of Comparative Example 3 was found to have a moisture concentration of 1102 ppm and an oxygen concentration of 3.0 vol %.

Comparative Example 4

An LED package of Comparative Example 4 was obtained in the same manner as in Comparative Example 1 except that nitrogen gas was not supplied to the globe box in which the placing step was performed, and the atmosphere in the anterior chamber of the globe box and the globe box in the storing step was air (temperature: 23° C., relative humidity: 12%). Vent gas from the glove box in the placing step was subjected to analyses using the electro-galvanic oxygen analyzer and the above capacitive (impedance) dew-point meter, and the atmosphere in the placing step of Comparative Example 4 was found to have a moisture concentration of 3080 ppm and an oxygen concentration of 21.0 vol %.

Comparative Example 5

An LED package of Comparative Example 5 was obtained in the same manner as in Comparative Example 4 except that nitrogen gas was not supplied to the globe box in which the placing step was performed, and the atmosphere in the anterior chamber of the globe box and the globe box in the storing step was air (temperature: 26° C., relative humidity: 16.5%). Vent gas from the glove box in the placing step was subjected to analyses using the electro-galvanic oxygen analyzer and the above capacitive (impedance) dew-point meter, and the atmosphere in the placing step of Comparative Example 5 was found to have a moisture concentration of 5017 ppm and an oxygen concentration of 21.0 vol %.

Comparative Example 6

An LED package of Comparative Example 6 was obtained in the same manner as in Comparative Example 5 except that the dry atmosphere in the storing step of Example 1 was used in the storing step, nitrogen gas was not supplied to the globe box in which the placing step was performed, and the atmosphere in the anterior chamber of the globe box and the globe box in the storing step was air (temperature: 10° C., relative humidity: 8.5%). Vent gas from the glove box in the placing step was subjected to analyses using the electro-galvanic oxygen analyzer and the above capacitive (impedance) dew-point meter, and the atmosphere in the placing step of Comparative Example 6 was found to have a moisture concentration of 1001 ppm and an oxygen concentration of 21.0 vol %.

For the optical semiconductor devices of Examples 1 to 5 and Comparative Examples 1 to 6 above, the oxygen concentration and the moisture concentration in the optical semiconductor devices and the reliability of the LED packages were analyzed according to the following evaluation method.

<Method of Evaluating Oxygen Concentration and Moisture Concentration in Optical Semiconductor Device>

The components of the gas in the region surrounded by the package substrate and the window of each optical semiconductor device (LED package) were subjected to quantitative analysis using a mass spectrometer (Internal Vapor Analysis: IVA), and the inside of the confined space was subjected to analyses by removing the light transparent window at the sample inlet. The lower measurement limit of the oxygen concentration by IVA (OXYGEN) was 0.1 [vol %], and the lower measurement limit of the moisture concentration (MOISTURE) was 100 [volppm].

<Method of Evaluating High Temperature Energization Life>

Each of the optical semiconductor devices obtained by the manufacturing method according to this disclosure or Comparative Examples was mounted on a heat dissipating substrate made of aluminum, and the heat dissipating substrate on which the optical semiconductor device had been mounted was then attached to a heat dissipating unit provided with a heat sink and a cooling fan, and the high temperature energization life under conditions of energization at 85° C. and 100 mA in air was evaluated.

A current of 350 mA was flown to the optical semiconductor device immediately after the mounting, and the initial light output was measured using an integrating sphere. This measurement was performed at room temperature. After that, the substrate on which the optical semiconductor device had been mounted was introduced into an 85° C. oven (air) together with the heat sink, and while this temperature environment was maintained, a current of 100 mA was flown to the LED, thus the LED was lit. The optical semiconductor device was taken out of the oven at time points after 168 hours, 500 hours, 1000 hours, 5000 hours, and 10000 hours from the start of the 100 mA energization, and the light output was measured using an integrating sphere after the optical semiconductor device was returned to room temperature and was compared with the initial light output. The relative value of the light output (350 mA) after 10,000 hours (amount of residual light) $P_{10000}/P_0$ where the initial light output was 1 is given in Table 1.

The high temperature energization life (85° C., 100 mA) was evaluated according to the following criteria (rounded off to two decimal places).

++: $P_{10000}/P_0 \geq 0.91$
+: $0.81 \leq P_{10000}/P_0 \leq 0.90$
−: $0.71 \leq P_{10000}/P_0 \leq 0.80$
−−: $P_{10000}/P_0 \leq 0.70$ The experiment results and the fabrication conditions of Example 1 to Example 5 and Comparative Example 1 to Comparative Example 6 are given in Table 1 below.

TABLE 1

|  |  | Example 1 | Example 2 | Example 3 | Example 4 | Example 5 | Comparative Example 1 |
|---|---|---|---|---|---|---|---|
| Baking step before mounting step |  | — | 250° C. for 30 min | — | — | — | — |
| Atmosphere in storing step Dry atmosphere - temp.: 23-27° C., moisture conc.: 1000 ppm or less Outside air - temp.: 23-27° C., humidity: 25-35[vol %] |  | Dry atmosphere | Dry atmosphere | Dry atmosphere | Dry atmosphere | Dry atmosphere | Outside air |
| Atmosphere in placing step | Inert gas (nitrogen gas) | Used | Used | Used | Used | Used | Used |
|  | Air Temperature (° C.) | — | — | Cooling 10 | Cooling 10 | Cooling 10 | — |
|  | Mixing ratio of mixed gas atmosphere (Inert gas:Air) | Inert gas | Inert gas | 8:1 | 7.4:1 | 6:1 | Inert gas |
|  | Moisture concentration of atmosphere in placing step [ppm] | 2.6 | 2.6 | 200 | 303 | 505 | 2.6 |
|  | Oxygen concentration of atmosphere in placing step [vol %] |  |  | 2.3 | 2.5 | 3.0 |  |
| Confined space of optical semiconductor device-Oxygen conc.[vol %] |  | 0.5 | 0.1 | 2.3 | 2.5 | 3.0 | 0.5 |
| Confined space of optical semiconductor device-Nitrogen conc.[vol %] |  | 98.5 | 98.9 | 97.6 | 97.4 | 96.9 | 98.5 |
| Confined space of optical semiconductor device-Moisture conc.[vol ppm] |  | 174 | 101 | 201 | 303 | 507 | 1295 |
| High temp energization life (85° C., 100 mA) evaluation | High temperature life | ++ | ++ | + | + | + | −− |
|  | $P_{10000}/P_0$ | 0.92 | 0.92 | 0.90 | 0.90 | 0.85 | 0.66 |

|  |  | Comparative Example 2 | Comparative Example 3 | Comparative Example 4 | Comparative Example 5 | Comparative Example 6 |
|---|---|---|---|---|---|---|
| Baking step before mounting step |  | — | — | — | — | — |
| Atmosphere in storing step Dry atmosphere - temp.: 23-27° C., moisture conc.: 1000 ppm or less Outside air - temp.: 23-27° C., humidity: 25-35[vol %] |  | Outside air | Outside air | Outside air | Outside air | Dry atmosphere |
| Atmosphere in placing step | Inert gas (nitrogen gas) | Used | Used | — | — | — |
|  | Air Temperature (° C.) | Heating 50 | Room temp. 23 | Room temp. 23 | Room temp. 26 | Cooling 10 |
|  | Mixing ratio of mixed gas atmosphere (Inert gas:Air) | 6:1 | 6:1 | Air | Air | Air |

TABLE 1-continued

|  |  | | | | | |
|---|---|---|---|---|---|---|
|  | Moisture concentration of atmosphere in placing step [ppm] | 2275 | 1102 | 3080 | 5017 | 1001 |
|  | Oxygen concentration of atmosphere in placing step [vol %] | 3.0 | 3.0 | 21.0 | 21.0 | 21.0 |
| Confined space of optical semiconductor device-Oxygen conc.[vol %] | | 3.0 | 3.0 | 21.0 | 21.0 | 21.0 |
| Confined space of optical semiconductor device-Nitrogen conc.[vol %] | | 96.9 | 96.9 | 78.0 | 78.0 | 78.0 |
| Confined space of optical semiconductor device-Moisture conc.[vol ppm] | | 2300 | 1178 | 3090 | 5042 | 1000 |
| High temp energization life (85° C., 100 mA) evaluation | High temperature life | -- | -- | -- | -- | - |
|  | $P_{10000}/P_0$ | 0.17 | 0.65 | 0.13 | 0.01 | 0.73 |

Based on the foregoing, the optical semiconductor devices obtained in Examples 1 to 5 each had a better high temperature life than the optical semiconductor devices obtained by the fabrication methods of Comparative Examples 1 to 6. Further, as typified by the comparison between Example 1 and Comparative Example 1, when moisture once penetrated into the package substrate and others in the storing step, even if the package substrate was subjected to the dry atmosphere after that, the moisture content in the package substrate after mounting was not sufficiently reduced, thus, it was found impossible to fabricate a semiconductor device with a favorable high temperature life.

INDUSTRIAL APPLICABILITY

This disclosure is useful since it provides an optical semiconductor device with which high reliability of a semiconductor chip operating at high temperatures is maintained for a long time and a method of manufacturing the same.

REFERENCE SIGNS LIST

1: Recess, space, or confined space
2: Optical semiconductor chip or LED chip
3: Package substrate
4: Light transparent window
5: Joint portion
5f: First metal layer
5d: Second metal layer
5e: Joint material
21: Substrate
22: Semiconductor laminate
23a, 23b: Electrode layer
51a, 51b: Joint metal
60: Temporary retaining unit
61: Temporary retainer body
62: Arm
63: Weight
$E_1$, $E_2$: Surface electrode
$Ecw_1$, $Ecw_2$: Rear surface electrode

The invention claimed is:

1. A method of manufacturing an optical semiconductor device, comprising:
    a mounting step of placing an optical semiconductor chip on a package substrate made of ceramic;
    a storing step of storing the package substrate after the mounting step in a first dry atmosphere;
    a placing step of subjecting the optical semiconductor chip on the package substrate to a second dry atmosphere and placing a light transparent window on a joint portion of the package substrate with a joint material therebetween; and
    a sealing step of joining the joint portion and the light transparent window with the joint material in a low oxygen concentration atmosphere having an oxygen concentration of 1 vol % or less, thereby encapsulating the optical semiconductor chip in a confined space formed by the package substrate and the light transparent window,
    wherein the confined space after the sealing step has a moisture concentration of 1000 ppm or less and an oxygen concentration of 3 vol % or less.

2. The method of manufacturing an optical semiconductor device, according to claim 1,
    wherein the first dry atmosphere has a moisture concentration of 1000 ppm or less, and
    the second dry atmosphere has a moisture concentration of 1000 ppm or less and an oxygen concentration of 4 vol % or less.

3. The method of manufacturing an optical semiconductor device, according to claim 1,
    wherein the confined space after the sealing step has a moisture concentration of 300 ppm or less and an oxygen concentration of 0.8 vol % or less.

4. The method of manufacturing an optical semiconductor device, according to claim 1,
    wherein the second dry atmosphere has a moisture concentration of 200 ppm to 1000 ppm and an oxygen concentration of 3 vol % or less.

5. The method of manufacturing an optical semiconductor device, according to claim 4,
    wherein the second dry atmosphere has a moisture concentration of 200 ppm to 550 ppm.

6. An optical semiconductor device, comprising:
    a package substrate made of ceramic; and
    an optical semiconductor chip placed on the package substrate,
    wherein the optical semiconductor chip is encapsulated in a confined space between a light transparent window and the package substrate, the light transparent window being joined to a joint material on a joint portion of the package substrate therebetween, and
    the confined space has a moisture concentration of 1000 ppm or less and an oxygen concentration of 3 vol % or less.

7. The optical semiconductor device according to claim 6, wherein a center emission wavelength of the optical semiconductor chip is 200 nm to 350 nm.

* * * * *